United States Patent [19]

Engelson et al.

[11] Patent Number: 4,761,604
[45] Date of Patent: Aug. 2, 1988

[54] IDENTIFICATION OF CARRIER FREQUENCY FOR PULSED SIGNALS

[75] Inventors: Morris Engelson, Portland; Clifford D. Morgan, Newberg; Ivan E. Waltz, Hillsboro, all of Oreg.

[73] Assignee: Tektronix, Inc., Beaverton, Oreg.

[21] Appl. No.: 43,123

[22] Filed: Apr. 27, 1987

[51] Int. Cl.$^4$ .................................... G01R 23/02
[52] U.S. Cl. .................................. 324/78 R; 324/77 B
[58] Field of Search ................. 324/77 B, 78 R, 78 E, 324/78 N, 78 D, 79 R, 79 D

[56] References Cited

U.S. PATENT DOCUMENTS

| | | | |
|---|---|---|---|
| 3,665,512 | 5/1972 | Hall et al. | 324/77 B |
| 3,723,870 | 3/1973 | Donahue | 324/78 R |
| 4,438,392 | 3/1984 | Morwing | 324/79 R |
| 4,611,165 | 9/1986 | Nussbaum | 324/77 B |

Primary Examiner—Stewart J. Levy
Assistant Examiner—Louis M. Arana
Attorney, Agent, or Firm—Francis I. Gray

[57] ABSTRACT

A method for determining the carrier frequency of a pulsed signal based upon nominal parameters for the pulsed signal input by an operator selects an algorithm based upon a duty factor calculated from the nominal parameters. For large duty factors a conventional maximum peak detection algorithm is used to identify a spectral line having the greatest amplitude as the carrier frequency. For smaller duty factors the first nulls on each side of the main lobe of the frequency spectrum for the pulsed signal are determined and used to calculate a carrier frequency. The spectral line having the maximum peak value within a window about the calculated carrier frequency is identified as the carrier frequency.

3 Claims, 9 Drawing Sheets

IDENTIFICATION OF CARRIER FREQUENCY FOR PULSED SIGNALS

BACKGROUND OF THE INVENTION

The present invention relates to techniques for determining signal characteristics, and more particularly to a method for automatically identifying the carrier frequency of a pulsed signal using a spectrum analyzer for accurately counting the frequency of selected signals.

In the analysis and design of electronic devices it is important to determine the characteristics of various electrical signals which exist within the electronic devices. The two principal instruments which have been developed for this purpose are the oscilloscope, which displays the signal in terms of amplitude and time, and the spectrum analyzer, which displays the signal in terms of amplitude and frequency. By observing the displayed signals produced by these instruments the characteristics of the signals may be determined by a skilled operator. With the advent of microprocessor controlled instruments the goal is to make these instruments more "user friendly", i.e., make the instruments so easy to use that measurements can be made with little operator interaction or experience.

On a spectrum analyzer signals are displayed as a plurality of frequency components, each component having an amplitude corresponding to the strength of that component. Therefore, for pulse signals there is displayed a main lobe centered about a carrier frequency. This main lobe contains a plurality of spectral lines separated by the pulse repetition frequency of the pulsed signal. A plurality of side lobes representing the harmonic frequencies of the main lobe exist on either side of the main lobe separated by 1/PW, where PW is the pulse width of the pulsed signal. The frequency spectrum may become so complex that it is not easy to determine precisely by observation of the main lobe which spectral line represents the carrier frequency for the pulsed signal.

What is desired is a method for automatically identifying the carrier frequency of a pulsed signal with minimal operator interaction.

SUMMARY OF THE INVENTION

Accordingly the present invention provides a method for automatically identifying the carrier frequency of a pulsed signal using a spectrum analyzer to accurately count the frequency of selected signals. Based upon data input by an operator for a nominal pulsed signal a duty factor is calculated, and an appropriate algorithm is accessed. For large duty factors, greater than 0.1, the carrier frequency is directly identified by finding the spectral line having the maximum amplitude in the main lobe of the pulsed waveform. For smaller duty factors, less than 0.1, the null locations on either side of the main lobe are determined. The closest symmetrical spectral lines to the respective nulls within the main lobe are obtained and averaged to obtain a calculated carrier frequency. Then a window on the order of one pulse repetition frequency in width is established about the calculated carrier frequency and the spectral line within the window having the maximum amplitude is determined to be the carrier frequency.

The objects, advantages and novel features of the present invention will be apparent from the following detailed description when read in conjunction with the appended claims and attached drawing.

DESCRIPTION OF THE PREFERRED EMBODIMENT

Figure 1:
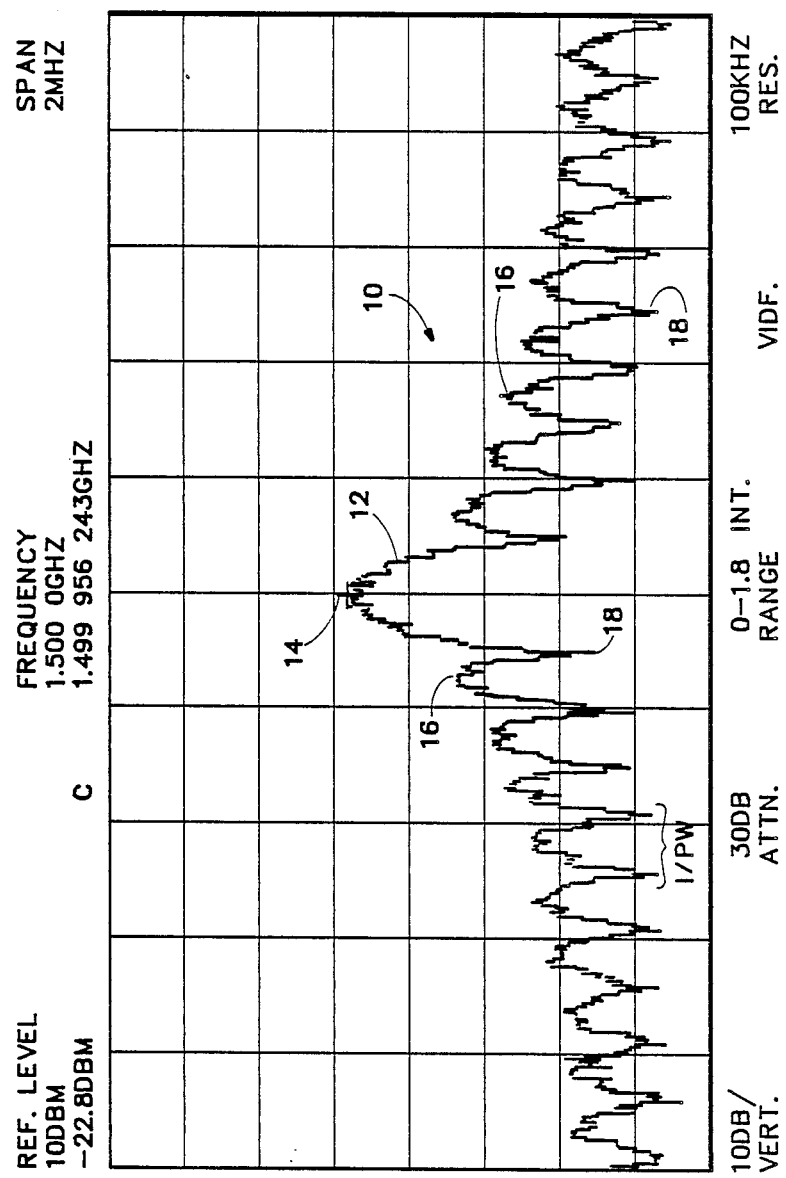
FIG. 1 is an initial setup screen for a spectrum analyzer using the carrier frequency determination method of the present invention for an input pulsed signal.
Figure 8A:
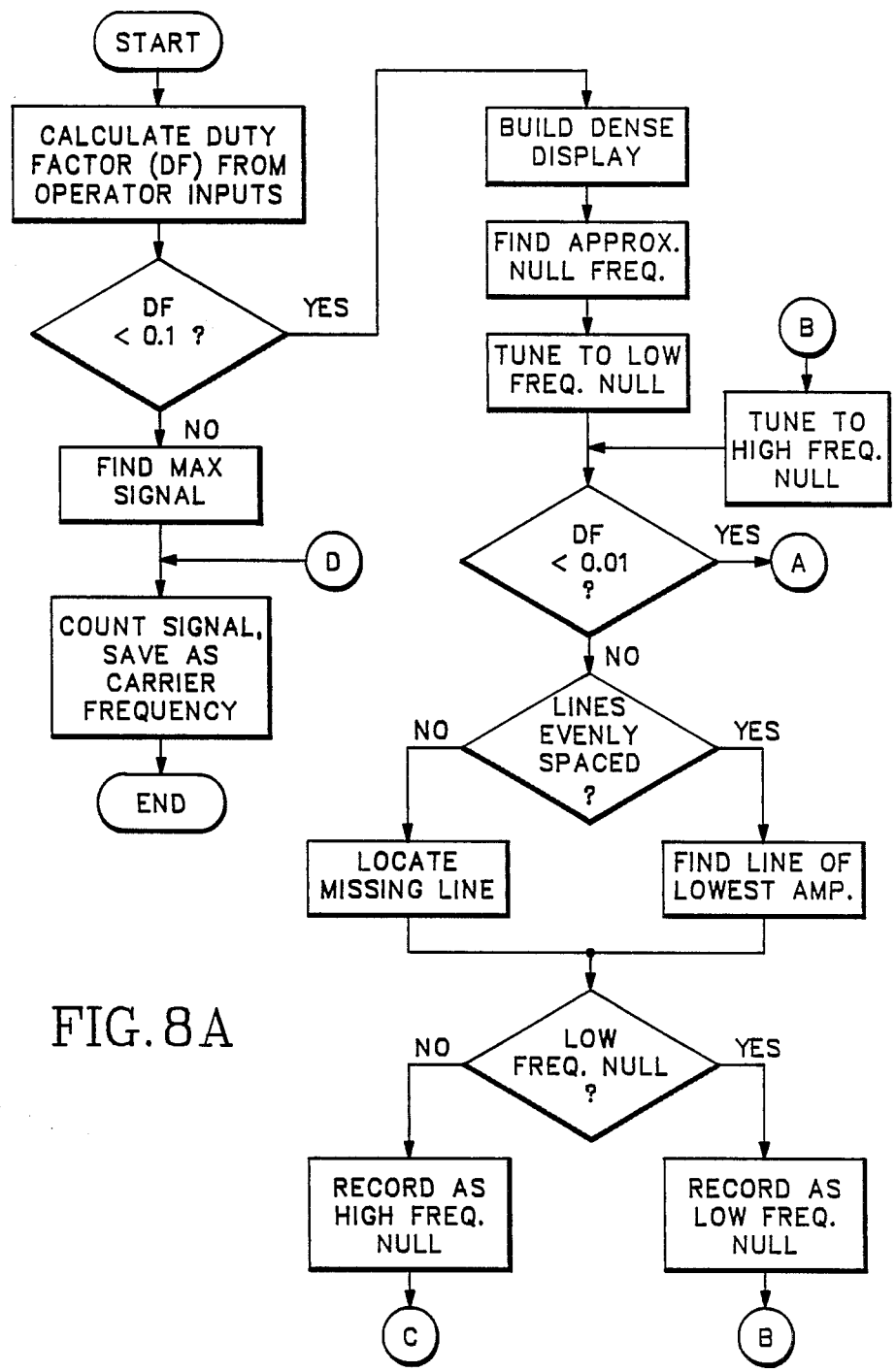
FIGS. 8A and 8B together are a flow chart of the carrier frequency determination method according to the present invention.
Figure 8B:
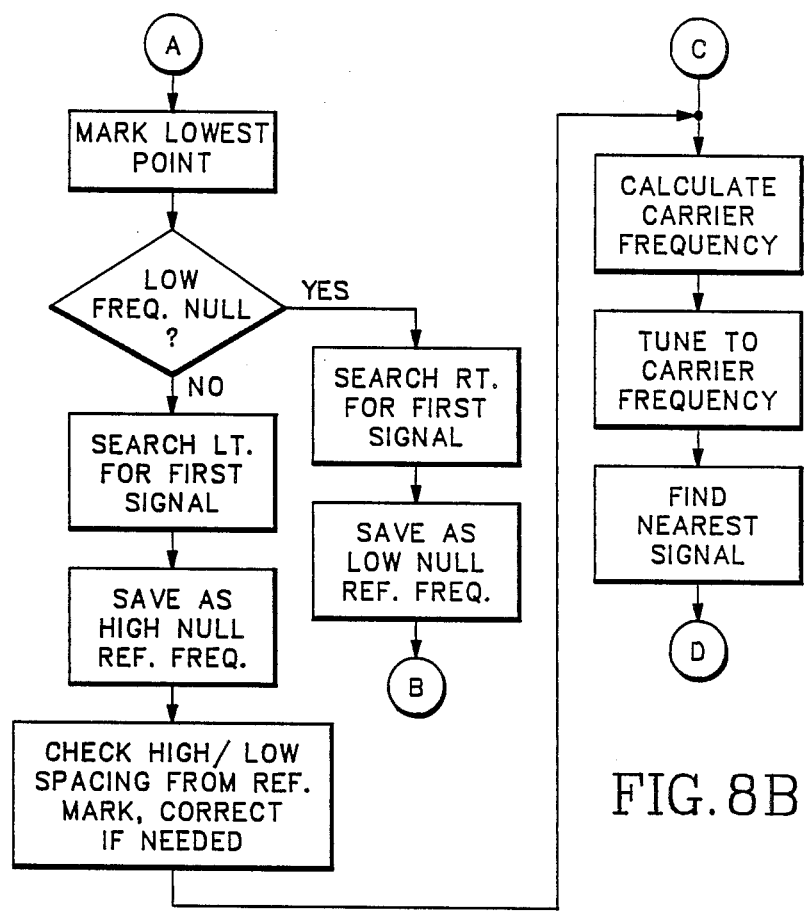

Referring now to the Figures an operator seeks to determine the actual carrier frequency of a pulsed signal, such as that of a radar system, having nominal parameters of carrier frequency, pulse width, pulse repetition frequency and peak power. The operator is prompted to input these nominal parameters, and from these parameters a nominal duty factor is calculated as well as an apparent power level derived from the nominal duty factor and nominal peak power as indicated in FIG. 8A. A spectrum analyzer using this method is then set up to the proper frequency range, reference level, span, resolution bandwidth and sensitivity to display a sufficient portion of the frequency spectrum to assure that the peak, or main lobe, of the input pulsed signal is displayed as shown in FIG. 1 in the dense mode, i.e., without individual frequency component or spectral line resolution. Shown in FIG. 1 is the frequency spectrum in a dense display mode 10 for a pulsed signal. A main lobe 12 has a peak amplitude, indicated by a marker 14, greater than that of the side lobes 16 arrayed symmetrically on either side. In this display mode the frequency components, or spectral lines, are not shown. The distance between nulls 18 of the side lobes 16 is equal to 1/PW, and the width between nulls of the main lobe 12 is 2/PW. The values about the frequency display represent the set up values for the spectrum analyzer and the actual frequency count C and level for the marker 14 location. For the display shown the nominal frequency is 1.5 GHz, the display span is 10 MHz corresponding to approximately ten pulse widths, the reference level at the top of the display is 10 dBm, the vertical scale is 10 dB per vertical division, the attenuation is 30 dB, the resolution is 100 kHz and the spectrum analyzer is in the 0–1.8 GHz range.

Figure 2:
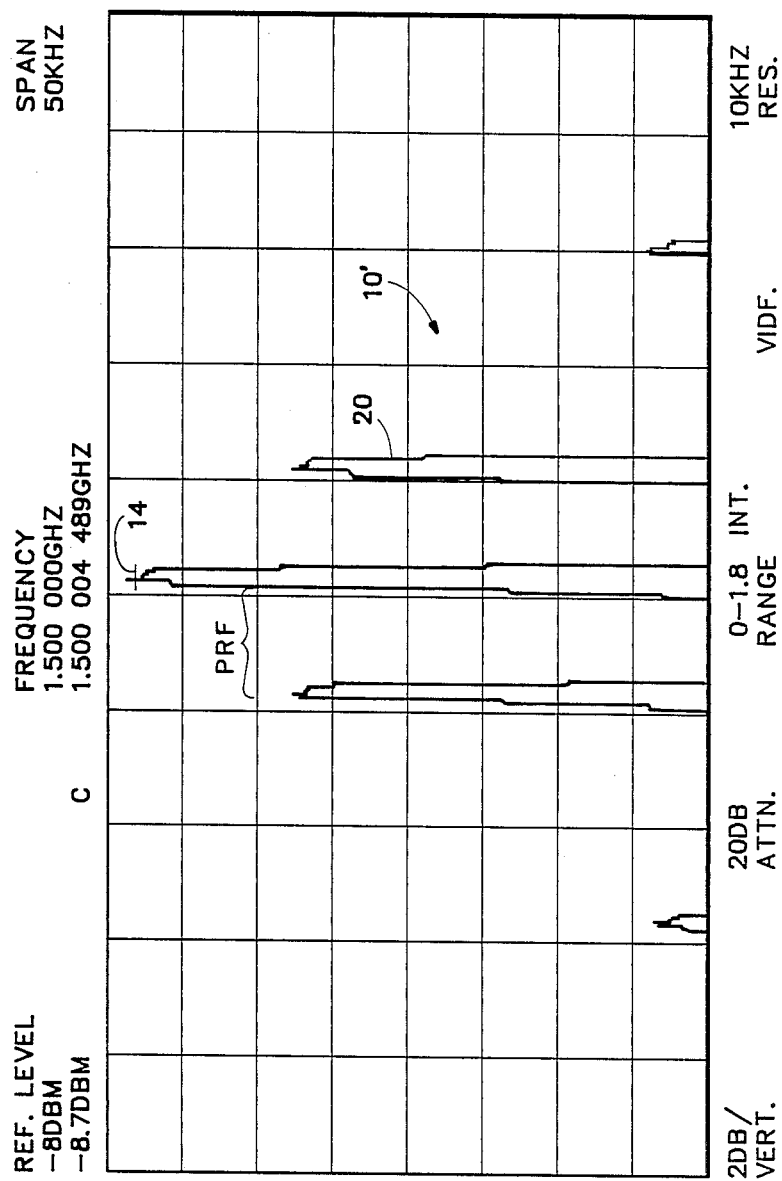
FIG. 2 is a screen representing carrier frequency determination for large duty factors of an input pulsed signal.

The displayed frequency spectrum is adjusted so that the maximum amplitude is centered and placed at the top of the display. If the duty factor is large, such as greater than 0.1, then a conventional technique is used. As shown in FIG. 2 the span is changed based upon the pulse repetition frequency input by the operator, the sensitivity and resolution are increased and the display is switched from the dense mode 10 to a resolve mode 10' where each spectral component line 20 is displayed. The maximum peak is identified by the marker 14 and the frequency counted. The resulting frequency is the actual carrier frequency.

Figure 3:
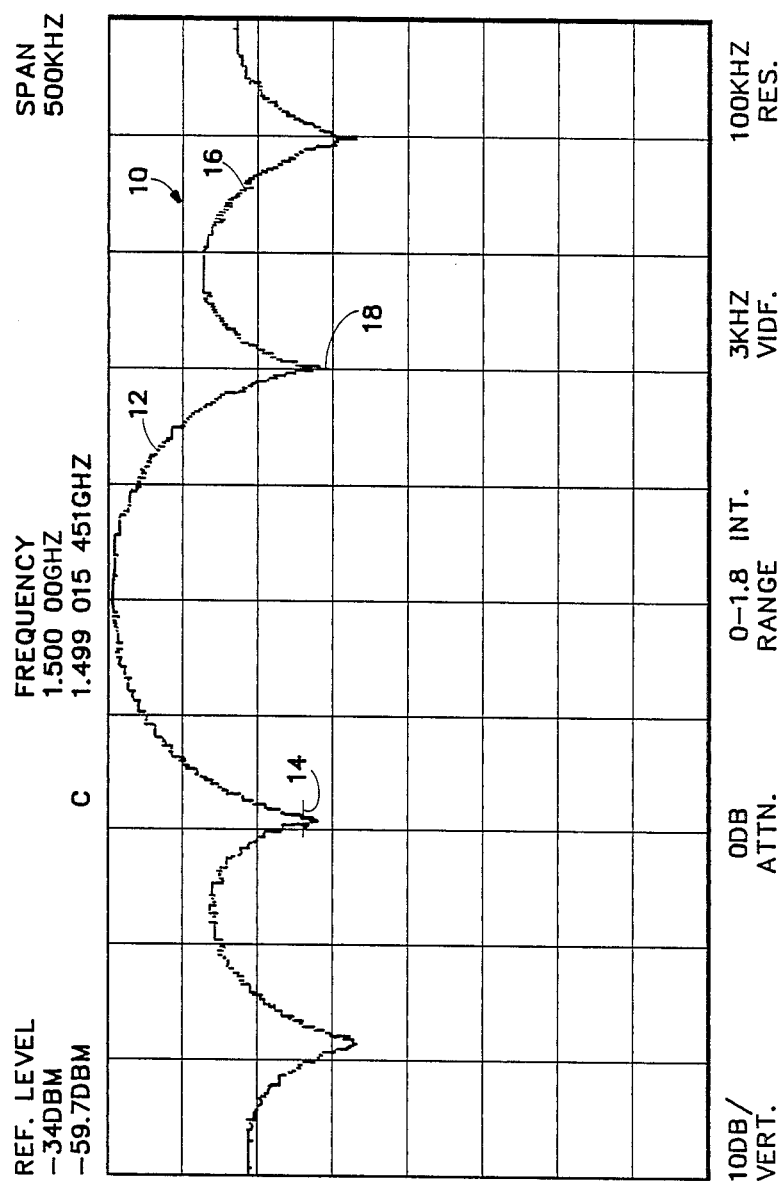
FIG. 3 is a screen representing an initial step in the carrier frequency determination method for smaller duty factors of an input pulsed signal.
Figure 4:
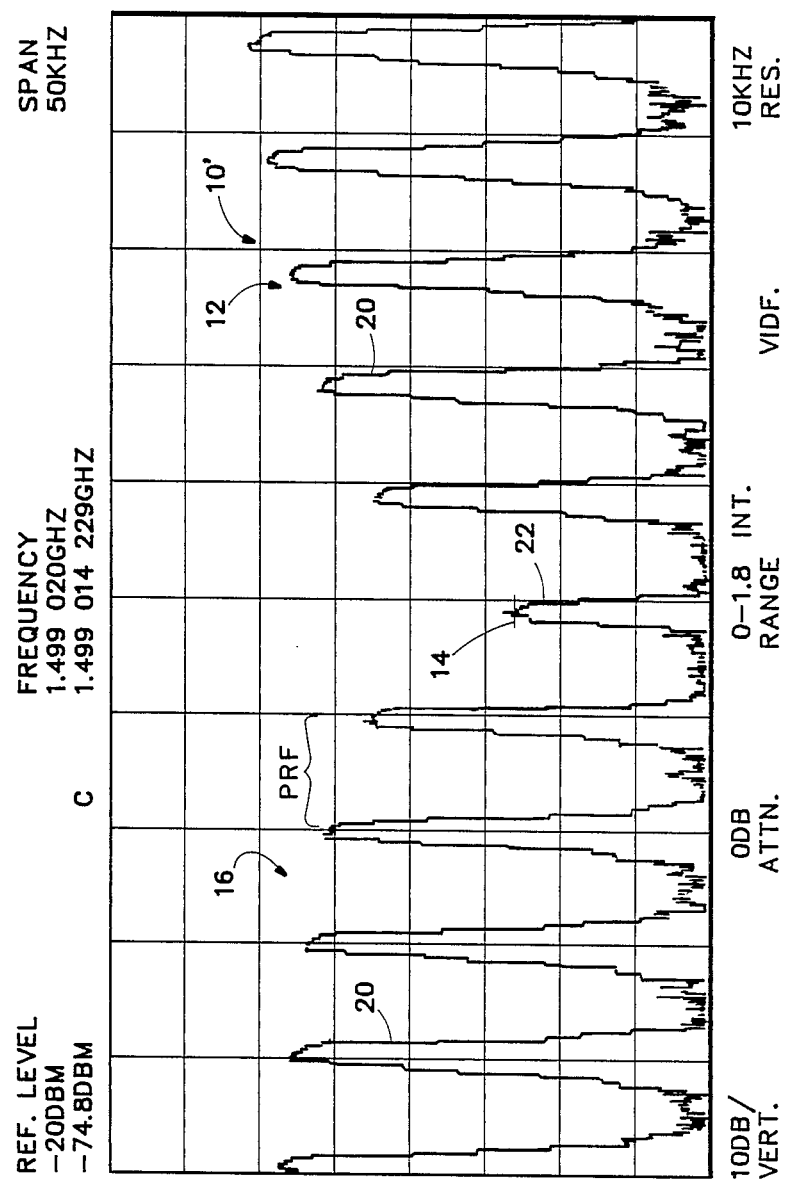
FIG. 4 is a screen representing a null determination for the carrier frequency determination method.
Figure 5:
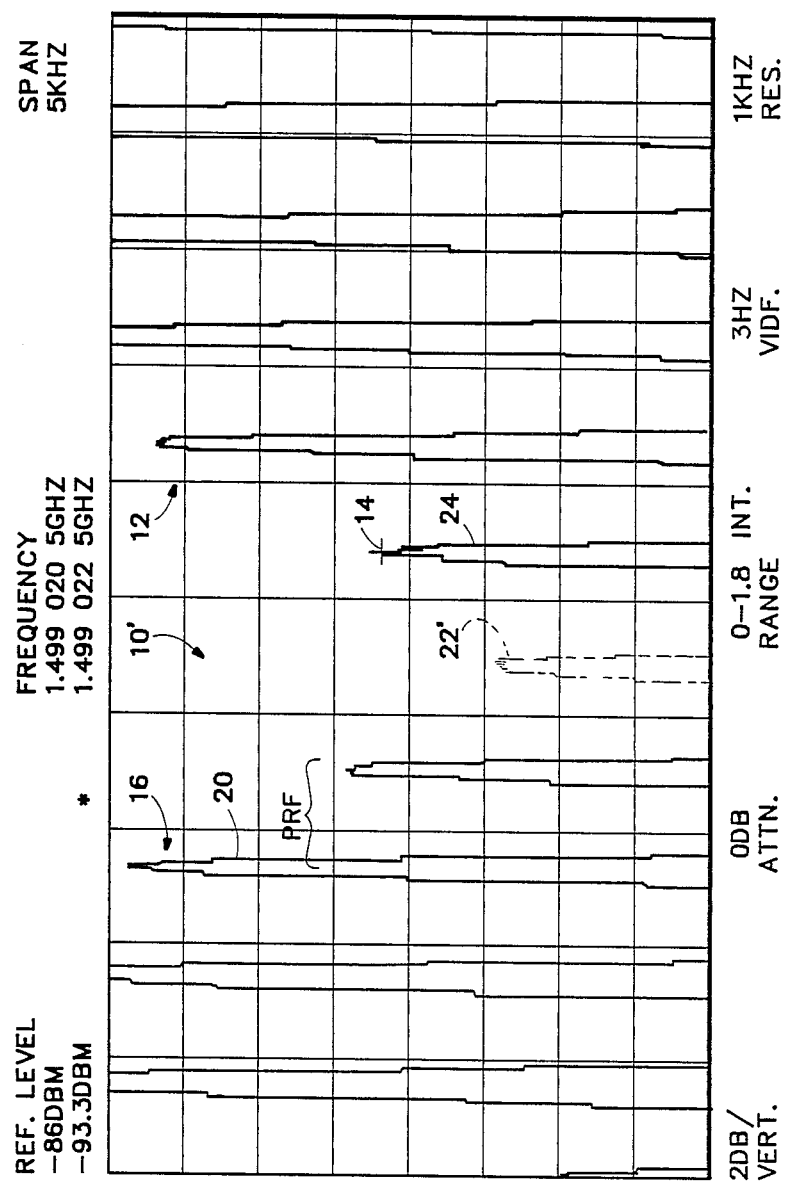
FIG. 5 is a screen representing a null determination for the carrier frequency determination method when there is a missing spectral line.

For small duty factors, such as less than 0.1, a special technique is used. A window is established from peak to peak of the adjacent harmonic lobes 16 on either side of the main lobe 12 in the dense display mode 10 and the approximate null frequencies are located by the marker 14 as shown in FIG. 3 on either side of the main lobe. The display is then switched to the resolve mode 10' and centered about one of the null frequencies. The spectral lines 20 are cataloged and the lowest one 22 is identified by the marker 14 as shown in FIG. 4. The same process is used to locate the opposite lowest spectral line on the opposite side of the main lobe 12. If the spectral lines 20 are not evenly spaced, indicating a missing line 22' as shown in FIG. 5, then the spectral line 24 nearest the carrier frequency from the missing line 22' is determined. The determined spectral line 24 is then corrected by using the actual pulse repetition frequency for the pulsed signal based upon the interval between spectral lines 20 so that the spectral line values actually used are situated equally from the carrier frequency.

Figure 6:
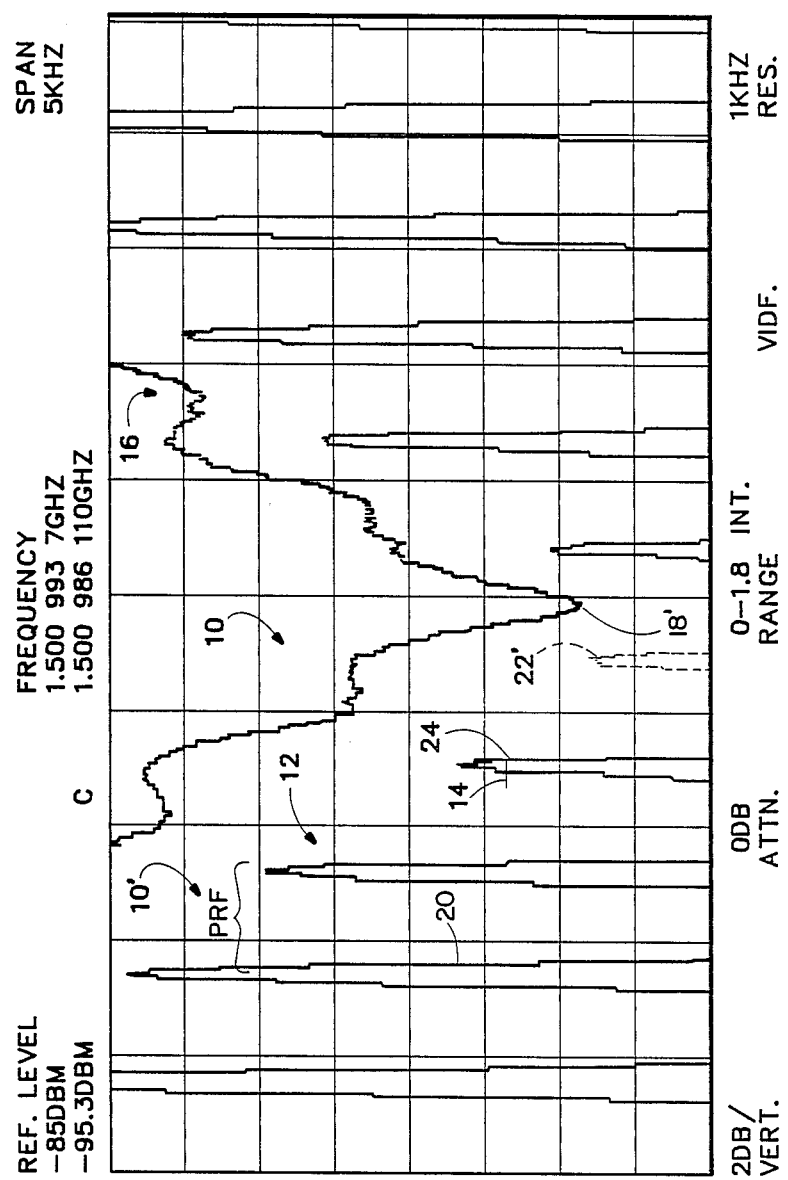
FIG. 6 is a screen representing the use of a superimposed dense display to point to a null according to the carrier frequency determination method of the present invention.

For very small duty factors, such as less than 0.01, the dense display 10 is used with the resolve display 10' to determine the null frequencies as shown in FIG. 6. The dense display minimum value 18' points to the null frequency. The first spectral line 24 closest to the carrier frequency is saved. The left and right null frequencies are then corrected if necessary based upon the number of spectral lines 22' missing between the dense display pointer 18' and the saved spectral line 24. The resulting corrected spectral lines bracket the carrier frequency.

Figure 7:
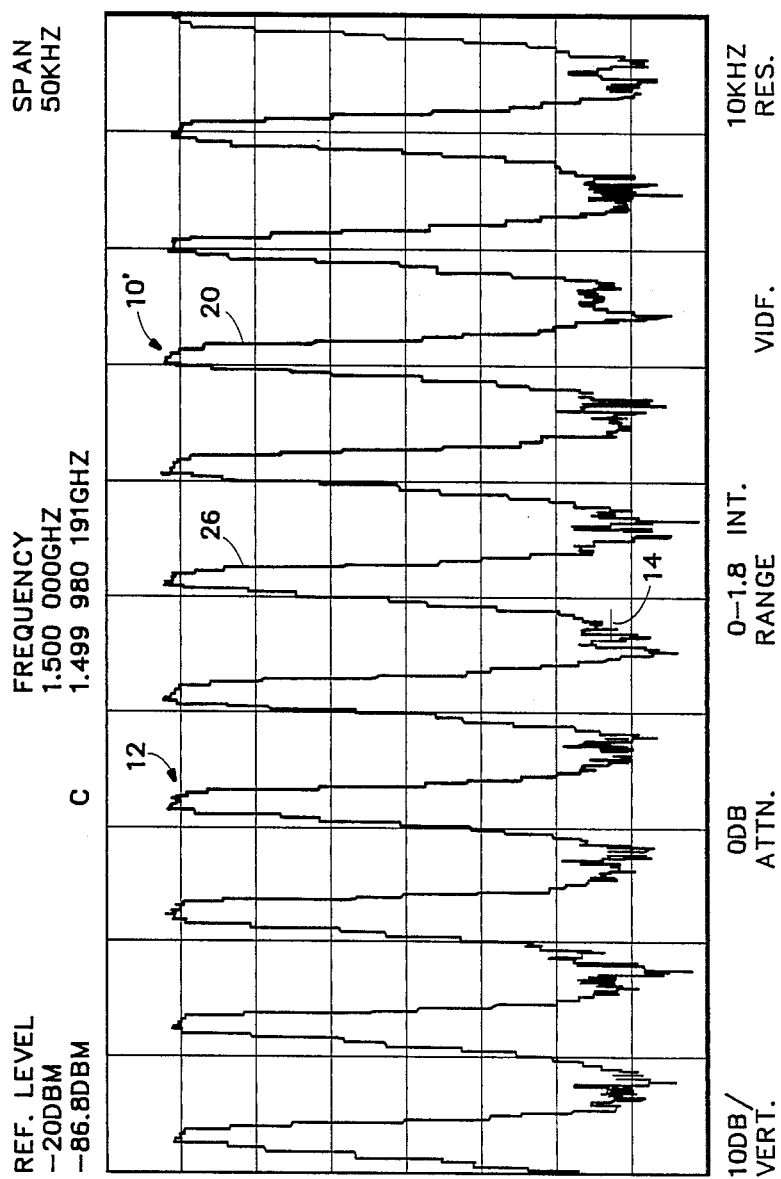
FIG. 7 is a screen representing the final determination of the carrier frequency for an input pulsed signal according to the method of the present invention.

The null signals are then used to calculate the carrier frequency. The display in the resolve mode 10' is centered on the calculated carrier frequency and a small window based upon the measured pulse repetition frequency is centered on the calculated carrier frequency as shown by the marker 14 in FIG. 7. The maximum peak value spectral line 26 within the window is counted by the spectrum analyzer's internal frequency counter and returned as the actual carrier frequency.

Thus the present invention provides a method for accurately, automatically determining the carrier frequency of a pulsed signal based upon operator supplied nominal parameters. Nulls on either side of the main lobe are located and used to calculate a carrier frequency, and then an actual carrier frequency within a window about the calculated carrier frequency is identified.

What is claimed is:

1. A method of determining the carrier frequency of a pulsed signal based upon nominal parameters comprising the steps of:

calculating a duty factor based upon the nominal parameters;

identifying from a plurality of spectral lines shown on a frequency domain display the spectral line having a maximum peak value as the carrier frequency if the duty factor is greater than a first predetermined value;

determining, when the duty factor is less than the first predetermined value, a null point on each side of a main lobe shown on the frequency domain display, the null points being symmetrical with respect to the main lobe;

calculating a carrier frequency from the null points; and identifying from a plurality of spectral lines a spectral line within a window about the calculated carrier frequency having a maximum peak value as the carrier frequency.

2. A method as recited in claim 1 wherein the determining step comprises the steps of:

recognizing when a spectral line near one of the null points is missing;

identifying a spectral line of the main lobe adjacent the missing spectral line as an initial null point; and correcting the initial null point based upon the symmetry of the main lobe and a measured value of the pulse repetition frequency of the pulsed signal to derive the null points symmetrical with respect to the main lobe.

3. A method as recited in claim 1 wherein the determining step comprises the steps of:

identifying a null pointer from a dense display of the frequency domain display;

locating from among a plurality of spectral lines about the null pointer a spectral line from the main lobe closest to the null pointer as an initial null point; and correcting the initial null point based upon the symmetry of the main lobe and a measured value of the pulse repetition frequency of the pulsed signal to derive the null points symmetrical with respect to the main lobe.

* * * * *